(12) United States Patent
Kawabe

(10) Patent No.: US 11,733,886 B2
(45) Date of Patent: Aug. 22, 2023

(54) SEMICONDUCTOR INTEGRATED CIRCUIT AND METHOD OF EXAMINING THE SEMICONDUCTOR INTEGRATED CIRCUIT

(71) Applicant: Kioxia Corporation, Tokyo (JP)

(72) Inventor: Takahisa Kawabe, Ebina (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/195,880

(22) Filed: Mar. 9, 2021

(65) Prior Publication Data

US 2022/0075538 A1 Mar. 10, 2022

(30) Foreign Application Priority Data

Sep. 7, 2020 (JP) ................................ 2020-149574

(51) Int. Cl.
*G06F 12/00* (2006.01)
*G06F 3/06* (2006.01)
*G06F 1/28* (2006.01)
*G11C 16/04* (2006.01)

(52) U.S. Cl.
CPC .......... *G06F 3/0632* (2013.01); *G06F 3/0604* (2013.01); *G06F 3/0659* (2013.01); *G06F 3/0679* (2013.01); *G06F 1/28* (2013.01); *G11C 16/0483* (2013.01)

(58) Field of Classification Search
CPC .... G06F 3/0632; G06F 3/0604; G06F 3/0659; G06F 3/0679; G06F 1/28; G11C 16/0483; G11C 16/26; G01R 31/281
See application file for complete search history.

(56) References Cited

U.S. PATENT DOCUMENTS

| 5,040,144 A * | 8/1991 | Pelley ..................... G11C 5/14 365/230.03 |
| 5,467,304 A | 11/1995 | Uchida et al. |
| 6,646,930 B2 | 11/2003 | Takeuchi et al. |
| 6,970,388 B2 | 11/2005 | Takeuchi et al. |
| 7,313,022 B2 | 12/2007 | Takeuchi et al. |
| 7,864,586 B2 * | 1/2011 | Tokiwa .................. G11C 7/109 365/185.17 |
| 2002/0039311 A1 * | 4/2002 | Takeuchi ............... G11C 16/20 365/185.09 |
| 2006/0120156 A1 * | 6/2006 | Kawai .................... G11C 16/20 365/185.17 |

(Continued)

FOREIGN PATENT DOCUMENTS

| JP | 06-274459 A | 9/1994 |
| JP | 08-221977 A | 8/1996 |

(Continued)

*Primary Examiner* — John A Lane
(74) *Attorney, Agent, or Firm* — Oblon, McClelland, Maier & Neustadt, L.L.P.

(57) ABSTRACT

According to one embodiment, a semiconductor integrated circuit includes a memory region, a selection circuit, a setting register, and a setting circuit. The memory region stores plural kinds of setting conditions. The selection circuit selects a particular setting condition from the plural kinds of the setting conditions to read the particular setting condition out of the memory region. The setting register stores the particular setting condition read out of the memory region. The setting circuit refers to the particular setting condition stored in the setting register to set an operating condition.

16 Claims, 7 Drawing Sheets

(56) References Cited

U.S. PATENT DOCUMENTS

2007/0253254 A1\* 11/2007 Morooka ............... G11C 16/20
 365/185.18
2017/0097830 A1\* 4/2017 Ehrenberg ............ G06F 21/602

FOREIGN PATENT DOCUMENTS

JP 2776247 B2 7/1998
TW 564424 B 12/2003

\* cited by examiner

| SETTING SIGNAL | | | MEMORY REGION | |
|---|---|---|---|---|
| S1 | S2 | S3 | BLOCK | WL |
| 0 | 0 | 0 | 0 | 34 |
| 0 | 0 | 1 | 0 | 50 |
| 0 | 1 | 0 | 0 | 8 |
| 0 | 1 | 1 | 0 | 17 |
| 1 | 0 | 0 | 0 | 62 |
| 1 | 0 | 1 | 0 | 78 |
| 1 | 1 | 0 | 0 | 45 |
| 1 | 1 | 1 | 0 | 28 |

| Vs | STORAGE MODE |
|----|--------------|
| 0  | QLC          |
| 1  | pTLC         |

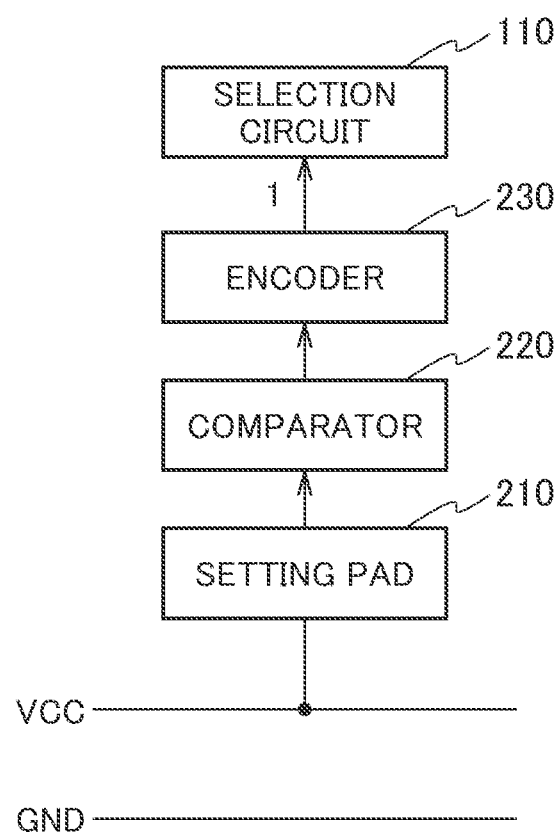

SEMICONDUCTOR INTEGRATED CIRCUIT AND METHOD OF EXAMINING THE SEMICONDUCTOR INTEGRATED CIRCUIT

CROSS-REFERENCE TO RELATED APPLICATIONS

This application is based upon and claims the benefit of priority from prior Japanese Patent Application P2020-149574 filed on Sep. 7, 2020; the entire contents of which are incorporated by reference herein.

FIELD

Embodiments described herein relate generally to a semiconductor integrated circuit and a method of examining the semiconductor integrated circuit.

BACKGROUND

Test processes for examining semiconductor integrated circuits before shipping need to be prepared so as to correspond to the number of kinds of specifications required for the semiconductor integrated circuits when the required specifications vary depending on the users. The increase in the number of the test processes increases the costs for implementing a test system used for the test processes and the costs for the management.

BRIEF DESCRIPTION OF THE DRAWINGS

FIG. 10 is a schematic diagram showing another example of setting the signal level of the setting signal based on the potential of the setting pad.

DETAILED DESCRIPTION

Figure 1:
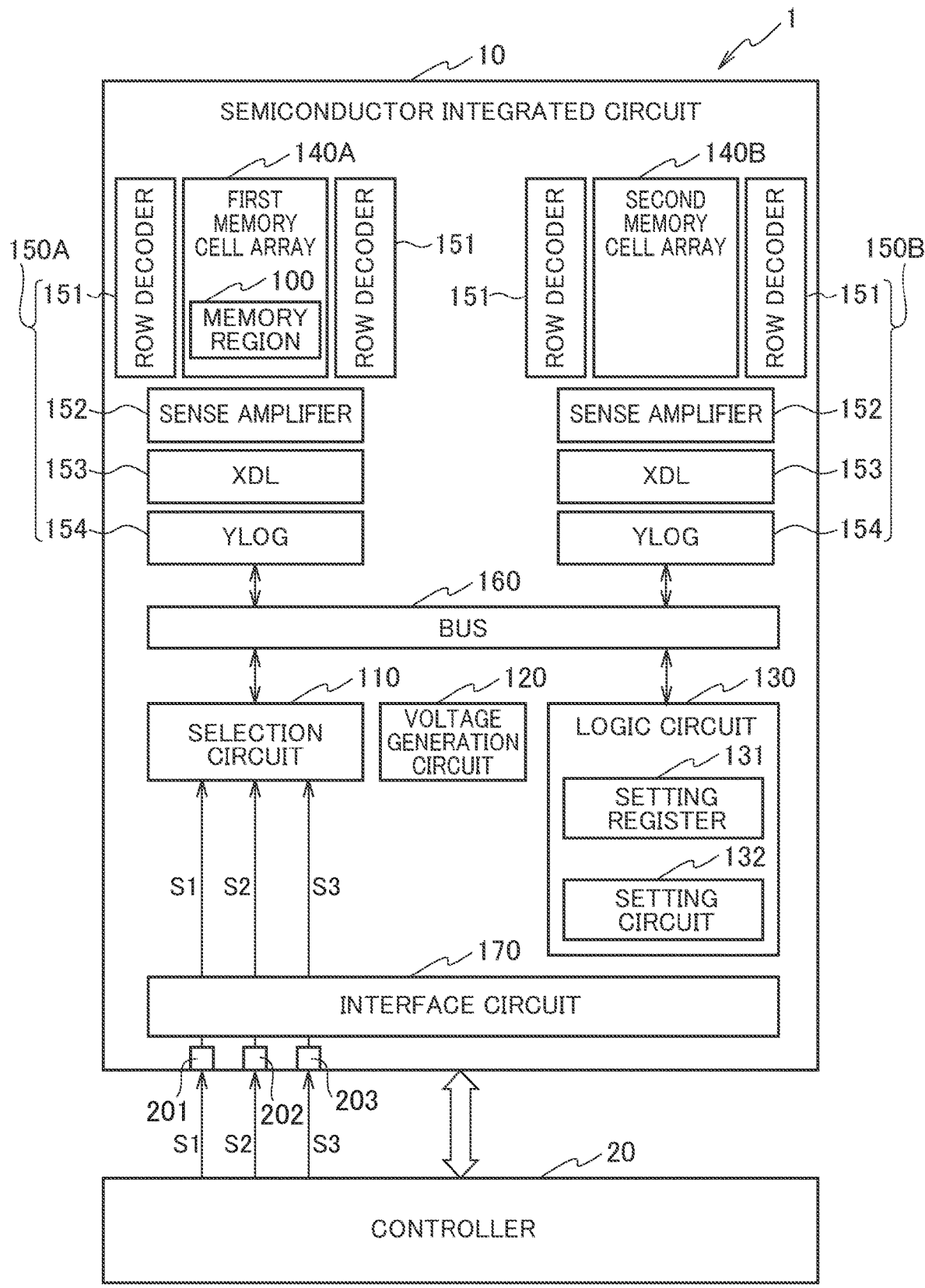
FIG. 1 is a schematic diagram showing a configuration of a semiconductor integrated circuit according to a first embodiment.

According to one embodiment, a semiconductor integrated circuit includes a memory region, a selection circuit, a setting register, and a setting circuit. The memory region stores plural kinds of setting conditions. The selection circuit selects a particular setting condition from the plural kinds of the setting conditions and reads the selected particular setting condition out of the memory region. The setting register stores the particular setting condition read out of the memory region. The setting circuit refers to the particular setting condition stored in the setting register to set an operating condition.

Embodiments are described below with reference to the drawings. The same elements described in the drawings are denoted by the same reference numerals, and overlapping explanations are not repeated below.

First Embodiment

A semiconductor integrated circuit 10 according to a first embodiment of the present invention includes a memory region 100, a selection circuit 110, a voltage generation circuit 120, and a logic circuit 130, as illustrated in FIG. 1. The logic circuit 130 includes a setting register 131 and a setting circuit 132.

The memory region 100 stores plural kinds of setting conditions for the semiconductor integrated circuit 10. The selection circuit 110 selects a particular setting condition from the plural setting conditions and reads the selected setting condition out of the memory region 100. The setting register 131 stores the particular setting condition read out of the memory region 100. The setting circuit 132 refers to the particular setting condition stored in the setting register 131 to set an operating condition for the semiconductor integrated circuit 10. The semiconductor integrated circuit 10 operates in accordance with the operating condition set by the setting circuit 132.

The demand for the specifications of the operations of the semiconductor integrated circuit 10 may differ depending on the user which is a shipping destination to which the semiconductor integrated circuit 10 is shipped. The memory region 100 stores plural kinds of setting conditions corresponding to plural specifications that the respective users are presumed to require, for example. The setting register 131 stores the setting condition to be referred to upon the setting of the operating condition for the semiconductor integrated circuit 10.

FIG. 1 is a diagram illustrating a case in which the semiconductor integrated circuit 10 according to the first embodiment is a NAND flash memory. When the semiconductor integrated circuit 10 is a NAND flash memory, the setting conditions stored in the memory region 100 include at least conditions for voltages set for a writing operation, a read-out operation, a deletion operation in the NAND flash memory, and conditions for setting the timing of executing the respective operations, for example. The writing operation, the read-out operation, and the deletion operation executed by the NAND flash memory are herein collectively referred to also as "operations of the NAND flash memory".

The setting conditions stored in the memory region 100 may include storage modes of the NAND flash memory. For example, the number of pieces of data (the number of bits) to be written differs between a quadruple level cell (QLC) mode that can store four bits of information per memory cell and a triple level cell (TLC) mode that can store three bits of information per memory cell. The setting of the operations of the NAND flash memory thus differs between the QLC mode and the TLC mode. In view of this, plural kinds of setting conditions for setting the operations of the NAND flash memory may be stored in the memory region 100 so as to be optimized for the respective storage modes to be used.

A pseudo TLC (pTLC) mode may be used for the NAND flash memory instead. The NAND flash memory using the pTLC mode is a product in the QLC mode but also has a product mode that can operate in the TLC mode simulatively.

The semiconductor integrated circuit 10 illustrated in FIG. 1 is the NAND flash memory including a first memory cell array 140A and a second memory cell array 140B. The memory region 100 is set in a part of the first memory cell array 140A.

The semiconductor integrated circuit 10 includes a peripheral circuit 150A that controls the operation of the first memory cell array 140A, and a peripheral circuit 150B that controls the operation of the second memory cell array 140B. The peripheral circuit 150A and the peripheral circuit 150B each include row decoders 151, a sense amplifier 152, XDL 153, and YLOG 154.

The row decoders 151 control word lines. The sense amplifier 152 controls bit lines. The XDL 153 temporarily stores data to be written in the memory cell array or data read out of the memory cell array. The YLOG 154 controls the flow of the data in the memory cell array upon the writing operation or the read-out operation.

The voltage generation circuit 120 generates a power supply voltage supplied to the respective circuits included in the semiconductor integrated circuit 10. The logic circuit 130 controls the peripheral circuit 150A, the peripheral circuit 150B, and the voltage generation circuit 120, and executes the respective operations of the NAND flash memory. Signals are transferred between the respective circuits via a bus 160 inside the semiconductor integrated circuit 10.

The semiconductor integrated circuit 10 is controlled by a controller 20. The data communication between the controller 20 and the semiconductor integrated circuit 10 and the power supply to the semiconductor integrated circuit are executed via an interface circuit 170 in the semiconductor integrated circuit 10. A memory system 1 including the semiconductor integrated circuit 10 and the controller 20 may be connected to a host device (not shown). The memory system 1 is a solid-state drive (SSD), for example.

The controller 20 may be fabricated by a circuit such as a system on a chip (SoC). The controller 20 integrally controls the operations of the memory system 1. The controller 20 may implement the respective functions by executing firmware. The respective functions of the controller 20 may be implemented by dedicated hardware inside the controller 20.

The controller 20 controls the communication between a host device and the semiconductor integrated circuit 10. The controller 20 receives a command from the host device to control the semiconductor integrated circuit 10 so as to execute the writing operation and the read-out operation. For example, the controller 20 controls the semiconductor integrated circuit 10 so as to write the data designated by a writing command. The controller 20 sends, to the host device, the data read out of an address in the semiconductor integrated circuit 10 designated by a read-out command, or controls the semiconductor integrated circuit 10 so as to execute the deletion operation to delete the stored data.

The state of the semiconductor integrated circuit 10 is initialized by use of the setting condition stored in the setting register 131 upon the execution of a power-on reset (POR). The operation of the semiconductor integrated circuit 10 upon the execution of the POR is controlled by the logic circuit 130.

The logic circuit 130 upon the execution of the POR reads information on a storage region that cannot be used because of a fault (skip flag information) out of a particular storage region in the NAND flash memory. The logic circuit 130 also reads out the operating condition stored in the setting register 131. The logic circuit 130 then sequentially sets predetermined setting points in the internal circuit of the semiconductor integrated circuit 10 in accordance with the operating condition. The semiconductor integrated circuit 10 is thus initialized to be in a state capable of receiving signals from the controller 20.

As described above, the setting circuit 312 refers to the particular setting condition stored in the setting register 131 to set the operating condition upon the execution of the POR. While FIG. 1 illustrates the case in which the setting register 131 is provided inside the logic circuit 130, but the setting register 131 may be provided at any other position in the semiconductor integrated circuit 10 instead of the position inside the logic circuit 130.

The semiconductor integrated circuit 10 illustrated in FIG. 1 includes a first setting pin 201, a second setting pin 202, and a third setting pin 203 to which setting signals are input that are used when the selection circuit 110 selects the setting condition. The first setting pin 201, the second setting pin 202, and the third setting pin 203 are hereinafter collectively referred to also as "setting pins 200".

A first setting signal S1 is input to the first setting pin 201, a second setting signal S2 is input to the second setting pin 202, and a third setting signal S3 is input to the third setting pin 203. The first setting signal S1 to the third setting signal S3 are hereinafter collectively referred to also as "setting signals S". For example, the setting signals S output from the controller 20 are input to the setting pins 200.

The setting signals S input to the setting pins 200 are input to the selection circuit 110. The selection circuit 110 selects the setting condition to be stored in the setting register 131 according to the signal levels of the setting signals S.

Figures 2, 3:
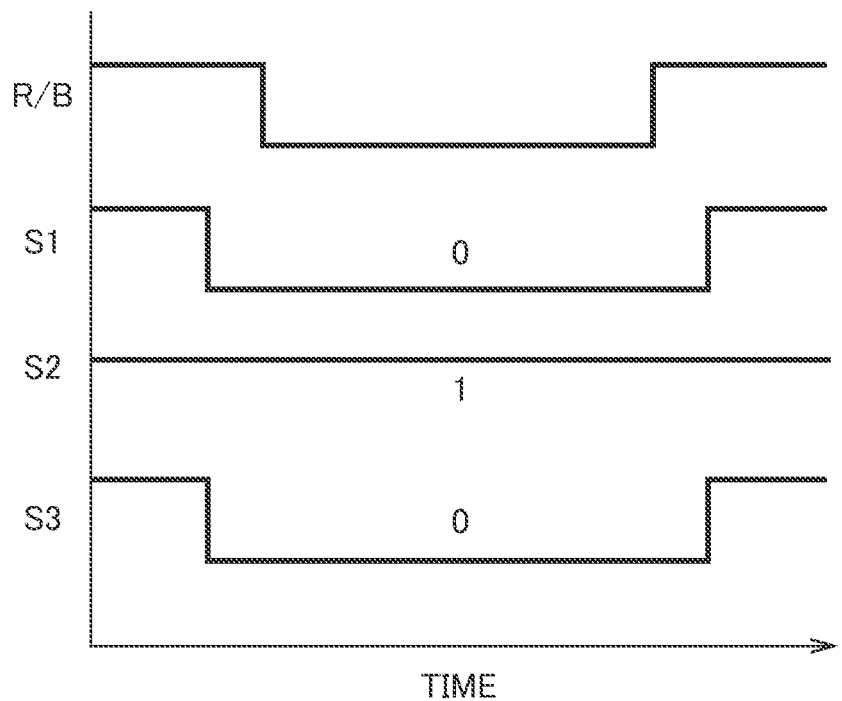
FIG. 2 is a table showing an example of a correspondence between signal levels of setting signals and addresses in a memory region.
FIG. 3 is a graph showing an example of the setting signals input to setting pins.

FIG. 2 is a table showing an example of a correspondence between the signal levels of the setting signals S and addresses in which the plural kinds of the setting conditions in the memory region 100 are stored. The signal levels of the setting signals S are either a high (H) level or a low (L) level. FIG. 2 indicates the signal at the H level as "1", and indicates the signal at the L level as "0". The same definitions are also applied to the following explanations.

For example, when the signal levels of the first setting signal S1 to the third setting signal S3 are all "0", the selection circuit 110 selectively reads, out of the memory region 100, the setting condition stored in a region designated by block "0" and word line (WL) "34" in the memory region 100. The signal levels of the setting signals S are thus linked with the respective addresses in the memory region 100 in which the particular setting condition is stored.

FIG. 3 is a graph showing an example of the setting signals S input to the setting pins 200. As illustrated in FIG. 3, a signal level of a ready/busy (R/B) pin shifts from the H level to the L level in the state in which the signal levels of the setting signals S are set for the respective setting pins 200. The signal levels of the setting signals S set for the setting pins 200 are input to the selection circuit 110 during a period in which the R/B pin is at the low level.

FIG. 3 illustrates the case in which the signal level of the first setting signal S1 is "0" (at the L level), the signal level of the second setting signal S2 is "1" (at the H level), and the signal level of the third setting signal S3 is "0" (at the L level). In this case, in the example illustrated in FIG. 2, the setting condition stored in the region designated by the block "0" and the word line (WL) "8" in the memory region 100 is selectively read out by the selection circuit 100. The selection circuit 110 stores the read setting condition in the setting register 131. The R/B pin then returns to the H level from the L level.

As described above, the semiconductor integrated circuit 10 stores the different setting conditions in the respective regions in the memory region 100. The setting circuit 132 reads, out of the memory region 100, the particular setting condition corresponding to the setting of the respective setting pins 200 when setting the operating condition of the semiconductor integrated circuit 10. The setting circuit 132 stores the read setting condition in the setting register 131. The operating condition of the semiconductor integrated circuit 10 is thus specified.

To set the operating condition of the semiconductor integrated circuit 10, the number of the setting pins 200 is defined as the number of the bits as described above. The number of the setting pins 200 to be prepared is determined depending on the number of the kinds of the setting conditions stored in the memory region 100. For example, when the number of the setting pins 200 is three, one setting condition can be selected from a maximum of the eight setting conditions.

The operating condition set with reference to the setting condition stored in the setting register 131 may be determined in a test process before product shipping of the semiconductor integrated circuit 10 (referred to below as a "shipping test"), for example. The shipping test is executed for the semiconductor integrated circuit 10 in a wafer state or the semiconductor integrated circuit 10 in a packaged state after being diced.

The shipping test includes several steps such as a step of detecting an initial fault of a product. The shipping test for the NAND flash memory adjusts per product the properties such as setting values of voltages upon the respective operations or a timing of the respective operations of the NAND flash memory. The properties adjusted by the shipping test are stored in the register or a predetermined temporary storage region per product.

In contrast to the semiconductor integrated circuit 10 according to the first embodiment, a semiconductor integrated circuit of a comparative example, which cannot change the contents in a register that stores setting conditions after the completion of a manufacturing process, has the following problems.

The semiconductor integrated circuit of the comparative example sets a register for storing the setting condition of the semiconductor integrated circuit depending on the specifications required by the user before the completion of the manufacturing process. When the required specifications vary depending on the shipping destination, several shipping tests corresponding to the number of the kinds of setting conditions set for the different users need to be prepared and managed. In addition, the shipping tests need to be prepared for the different specifications regarding the respective storage modes of the NAND flash memory such as the QLC mode and the pTLC mode. This increases the costs for implementing and managing a test system for the plural shipping tests.

Further, the semiconductor integrated circuit of the comparative example needs to repeatedly execute the shipping test to rewrite the setting of the register to conform to the specifications required by the shipping destination if the product in which only the setting of the register is changed is shipped or if the shipping destination is changed. This increases the costs and the time for the shipping test, which has an influence on the management of equipment such as a tester. In addition, the semiconductor integrated circuit of the comparative example may need to request the user to execute multi-parameter loading (MPL) if the shipping destination or the storage mode is changed after the execution of the shipping test. The term "MPL" refers to an operation of loading, in the NAND flash memory, the setting condition of the register written in the storage region in the NAND flash memory, and storing the setting contents in the register before the shipping of the product.

In contrast, the semiconductor integrated circuit 10 according to the first embodiment stores all of the setting conditions per shipping destination in the memory region 100 at the point of the execution of the shipping test. The semiconductor integrated circuit 10 selects the setting condition corresponding to the specifications required by the user from the plural setting conditions stored in the memory region 100 during the shipping test, and stores the selected setting condition in the setting register 131. This only needs to prepare the single shipping test for the semiconductor integrated circuit 10.

The semiconductor integrated circuit 10 thus can reduce the costs for implementing and managing the test system. The semiconductor integrated circuit 10 can eliminate the execution of MPL required in accordance with the specifications requested by the respective users or the storage modes of the NAND flash memory after the execution of the shipping test.

As described above, the semiconductor integrated circuit 10 according to the first embodiment includes the memory region 100 that stores the several kinds of the setting conditions, and stores in the setting register 131 the particular setting condition read out of the memory region 100. The semiconductor integrated circuit 10 thus can easily switch the setting conditions to be stored in the setting register 131. For example, the semiconductor integrated circuit 10 can change the pages on which the POR is executed after the execution of the shipping test.

The semiconductor integrated circuit 10 does not need to prepare and manage plural shipping tests to deal with the specifications required by the respective users. This can reduce the number of the types of the shipping tests prepared for the semiconductor integrated circuit 10, so as to improve the efficiency of the shipping test.

Figure 4:
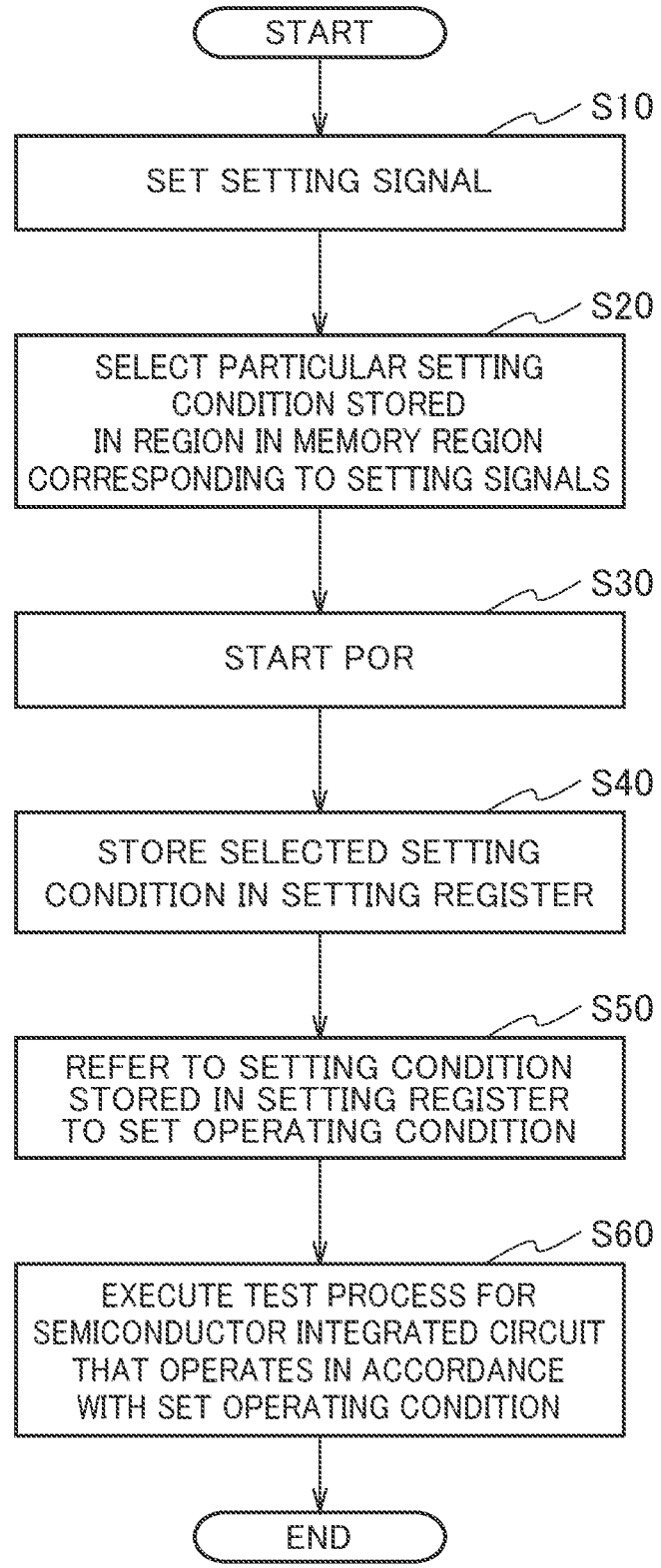
FIG. 4 is a flowchart for explaining a method of examining the semiconductor integrated circuit according to the first embodiment.

A method of examining the semiconductor integrated circuit 10 is described below with reference to the flowchart illustrated in FIG. 4. The following method is to examine the semiconductor integrated circuit 10 in the state in which the semiconductor integrated circuit 10 and the controller implement the memory system 1. The semiconductor integrated circuit 10 is in the packaged state.

In step S10, the controller 20 inputs the setting signals S at the predetermined signal levels to the setting pins 200 of the semiconductor integrated circuit 10. The signal levels of the setting signals S are determined depending on the specifications required for the semiconductor integrated circuit 10.

In step S20, the selection circuit 110 selects the particular setting condition stored in the region corresponding to the signal levels of the setting signals S in the memory region 100 that stores the plural kinds of the setting conditions. The selection circuit 110 selects the particular setting condition by referring to the correspondence between the signal levels of the setting signals S and the addresses in the memory region 100 as illustrated in FIG. 2, for example.

In step S30, the semiconductor integrated circuit 10 executes the POR. For example, the controller 20 sends a command for starting the POR to the semiconductor integrated circuit 10.

In step S40, the selection circuit 110 reads the selected particular setting condition out of the memory region 100. The selection circuit 110 stores the read particular setting condition in the setting register 131.

In step S50, the setting circuit 132 refers to the particular setting condition stored in the setting register 131 to set the operating condition of the semiconductor integrated circuit 10.

In step S60, the test process is executed for the semiconductor integrated circuit 10 that operates in accordance with the operating condition set by the setting circuit 132. The test process includes the steps of executing various tests such as detecting an initial fault of the semiconductor integrated circuit 10, and adjusting per product the properties such as setting values of voltages upon the respective operations or a timing of the respective operations of the NAND flash memory.

The present embodiment is illustrated above with the case in which the controller 20 sets the signal levels of the setting signals S input to the setting pins 200. In the test for the semiconductor integrated circuit 10 in the wafer state, the setting signals S at the predetermined signal levels may be input to the setting pins 200 from a tester via a probe in contact with the semiconductor integrated circuit 10, for example.

Second Embodiment

Figure 5:
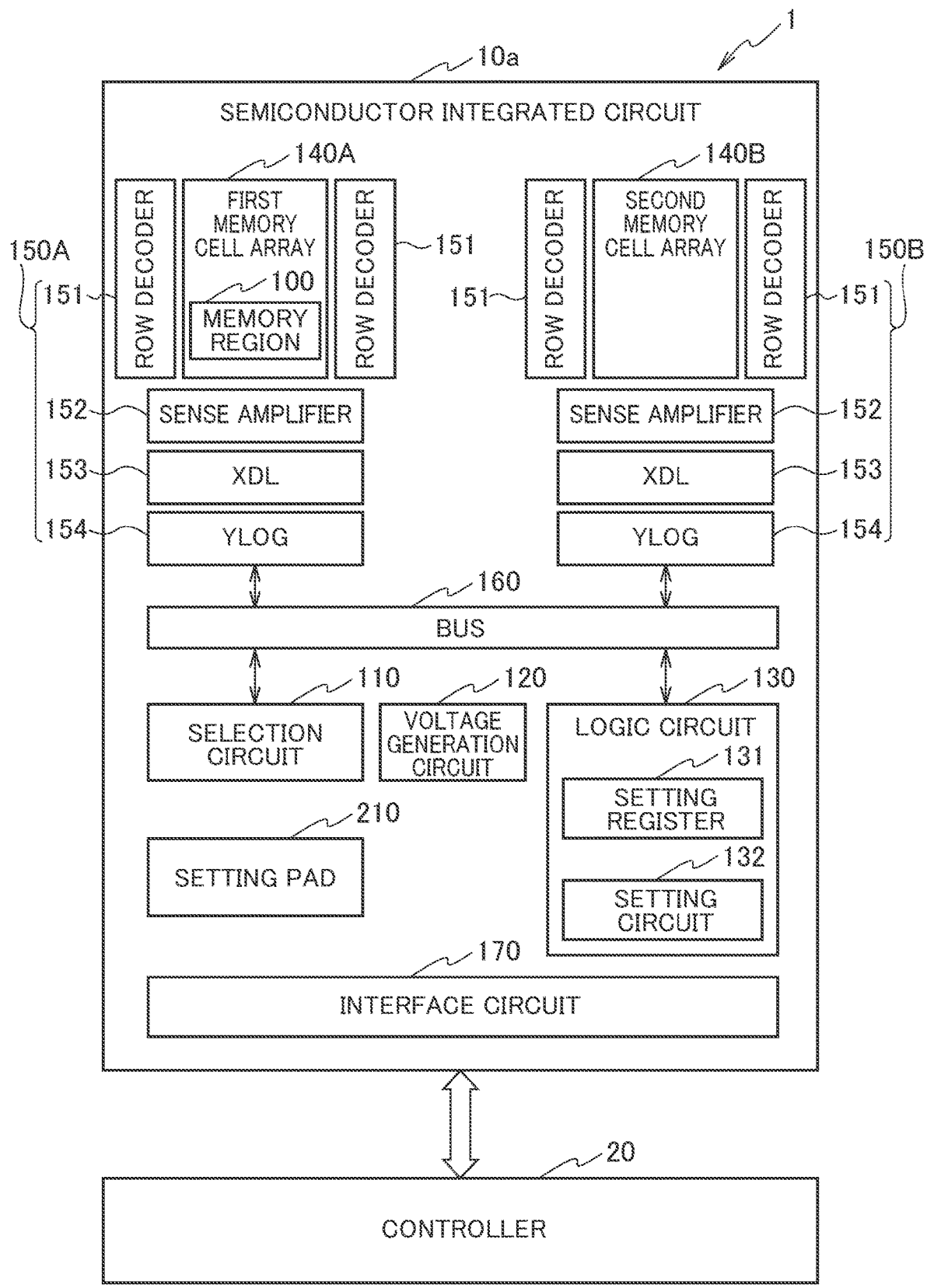
FIG. 5 is a schematic diagram showing a configuration of a semiconductor integrated circuit according to a second embodiment.

A semiconductor integrated circuit 10a according to a second embodiment of the present invention includes a setting pad 210, as illustrated in FIG. 5. The selection circuit 110 in the semiconductor integrated circuit 10a selects a setting condition to be stored in the setting register 131 in accordance with a potential of the setting pad 210. The semiconductor integrated circuit 10a illustrated in FIG. 5 differs from the semiconductor integrated circuit 10 illustrated in FIG. 1 in including the setting pad 210 instead of the setting pins 200.

The setting pad 210 is set at a predetermined potential so as to selects the particular setting condition to be stored in the setting register 131 from the plural kinds of the setting conditions stored in the memory region 100. For example, the setting pad 20 set at the H level may be connected to a power supply line VCC set at a plus potential. The setting pad 20 set at the L level may be connected to a ground line GND.

Figures 6, 7:
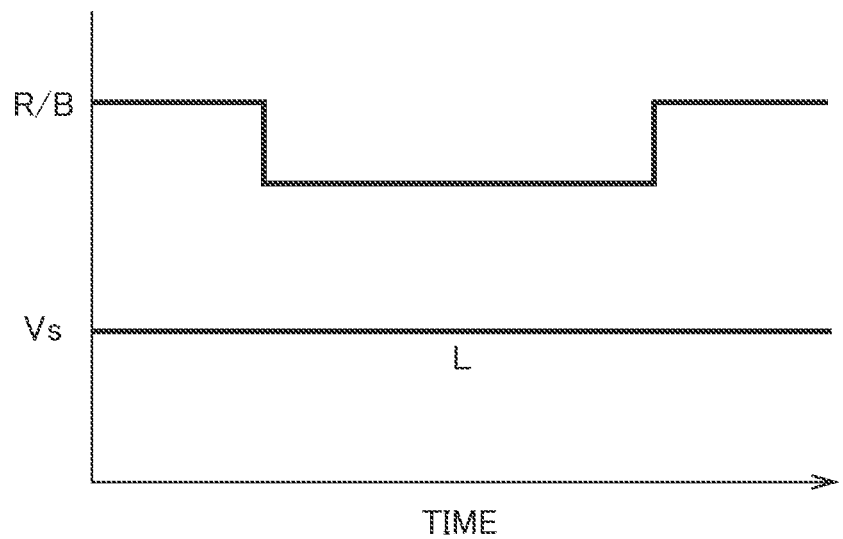
FIG. 6 is a table showing an example of a correspondence between a potential of a setting pad and a storage mode.
FIG. 7 is a graph showing an example of setting the potential of the setting pad.

For example, as illustrated in FIG. 6, the semiconductor integrated circuit 10a may be set to the QLC mode as a storage mode of the NAND flash memory in a case in which the potential Vs of the setting pad 210 is set to "0" (the L level). The semiconductor integrated circuit 10a may be set to the pTLC mode as a storage mode of the NAND flash memory in a case in which the potential Vs of the setting pad 210 is set to "1" (the H level).

FIG. 7 is a graph showing an example of setting the potential Vs of the setting pad 210 at the L level. The signal level of the ready/busy (R/B) pin shifts from the H level to the L level in the state in which the potential Vs of the setting pad 210 is set at the L level. The setting signal set to "0" corresponding to the L level of the potential Vs of the setting pad 210 is input to the selection circuit 110 during a period in which the R/B pin is at the low level.

Figure 8:
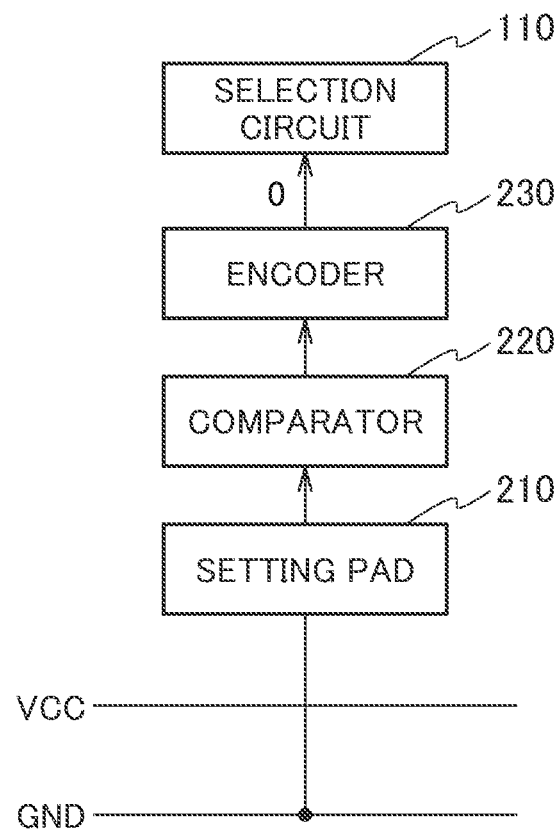
FIG. 8 is a schematic diagram showing an example of setting a signal level of a setting signal based on the potential of the setting pad.

At this point, the setting pad 210 may be electrically connected to the ground line GND, as illustrated in FIG. 8. This connection leads the potential Vs of the setting pad 210 to the L level. A comparator 220 compares the potential Vs of the setting pad 210 with a reference potential preliminarily set so as to determine whether the potential Vs of the setting pad 210 is at the H level or at the L level. The data of the determination result obtained by the comparator 220 is sent to an encoder 230. The encoder 230 encodes the data sent from the comparator 220. When the potential Vs of the setting pad 210 is at the L level, the encoder 230 sends the setting signal set to "0" to the selection circuit 110.

Figure 9:
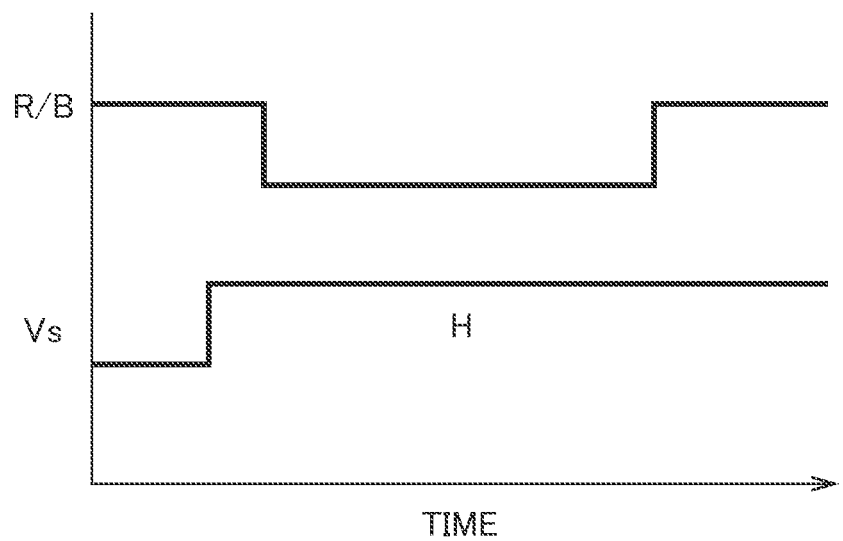
FIG. 9 is a graph showing another example of setting the potential of the setting pad.

FIG. 9 is a graph showing an example in which the potential Vs of the setting pad 210 is set at the H level. The setting signal set to "1" corresponding to the H level of the potential Vs of the setting pad 210 is input to the selection circuit 110 during the period in which the R/B pin is at the low level.

At this point, the setting pad 210 may be electrically connected to the power supply line VCC, as illustrated in FIG. 10. This connection leads the potential Vs of the setting pad 210 to the H level. The comparator 220 then determines that the potential Vs of the setting pad 210 is at the H level. The encoder 230 sends the setting signal set to "1" to the selection circuit 110.

The electrical connection between the setting pad 210 and the power supply line and the like may be made by use of a bonding wire. The connection by use of the bonding wire may be made in a wire-bonding step during the assembly of the semiconductor integrated circuit 10a upon packaging. In other words, the type of the power supply line to be electrically connected to the setting pad 210 may be determined depending on the specifications required by the shipping destination at the point of the assembly of the semiconductor integrated circuit 10a.

To set the operating condition of the semiconductor integrated circuit 10a, the potential of the setting pad 210 is defined as bits as described above. While the above embodiment is illustrated with the case of including the single setting pad 210, the plural setting pads 210 corresponding to the number of the setting conditions stored in the memory region 100 may be prepared.

When the three setting pads 210 are provided in the semiconductor integrated circuit 10a, the potentials of the respective setting pads 210 are presumed to be set to the H level, the H level, and the L level. The comparator 220 determines whether the respective potentials Vs of the setting pads 210 are either at the H level or at the L level. The encoder 230 then sends a digital signal "110" as the setting signal to the selection circuit 110.

The semiconductor integrated circuit 10a according to the second embodiment sets the potential Vs of the setting pad 210 in the wire-bonding step during the packaging, for example. The semiconductor integrated circuit 10a thus does not need to execute a preliminary operation such as MPL during the shipping test or during the use by the user. The term "preliminary operation" as used herein refers to an operation of causing the controller 20 or the like to change the setting condition to be stored in the setting register 131 in the semiconductor integrated circuit 10a. According to the semiconductor integrated circuit 10a, the efficiency during the shipping test or during the use by the user is improved.

The semiconductor integrated circuit 10a allows the product after being subjected to the shipping test to change the storage mode of the NAND flash memory, for example, in accordance with the setting of the potential Vs of the setting pad 210 upon the packaging. This can eliminate the process of repeatedly executing the shipping test in association with the change of the shipping destination.

The other configurations of the semiconductor integrated circuit 10a according to the second embodiment are substantially the same as those of the semiconductor integrated circuit 10 according to the first embodiment, and overlapping explanations are not repeated below. For example, the second embodiment also only needs to prepare the single test system for executing the shipping test used for the semiconductor integrated circuit 10a, so as to reduce the costs for implementing and managing the test system.

While FIG. 5 illustrates the case in which the semiconductor integrated circuit 10a does not include the setting pins 200, the semiconductor integrated circuit 10a may include both the setting pad 210 and the setting pins 200. For example, either the setting pad 210 or the setting pins 200 may set the conditions for setting the voltages upon the respective operations and the timing of executing the respective operations of the NAND flash memory. The other one of the setting pad 210 and the setting pins 200 may then set the storage mode of the NAND flash memory.

When both the setting pad 210 and the setting pins 200 are implemented in the semiconductor integrated circuit 10a, the operating condition of the semiconductor integrated circuit 10a can be selected in accordance with the setting of the setting pins 200 after the packaging process in which the setting of the setting pad 210 is confirmed. For example, a preferred setting condition of the setting register 131 can be stored in accordance with the setting of the setting pins 200 after the storage mode of the NAND flash memory is selected in accordance with the setting of the setting pad 210.

OTHER EMBODIMENTS

While the respective embodiments are illustrated above with the case of using the setting pins 200 as dedicated pins to which the setting signals S are input, the dedicated pins are not necessarily prepared to be used as the setting pins 200. For example, the pins in the semiconductor integrated circuit 10 not used during the POR may be used as the setting pins 200.

While the embodiments are illustrated above with the case in which the semiconductor integrated circuit 10 is the NAND flash memory, the semiconductor integrated circuit 10 may be any other type of memory device. The semiconductor integrated circuit 10 may be any device other than the memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a setting pad;
a memory region configured to store plural kinds of setting conditions;
a selection circuit configured to select a particular setting condition in accordance with a potential of the setting pad from the plural kinds of the setting conditions to read the particular setting condition out of the memory region;
a setting register configured to store the particular setting condition read out of the memory region;
a setting circuit configured to refer to the particular setting condition stored in the setting register to set an operating condition a comparator configured to compare the potential of the setting pad with a reference potential and determine the potential of the setting pad; and
an encoder configured to encode data based on a result determined by the comparator,
wherein the selection circuit is further configured to select the particular setting condition in accordance with the potential of the setting pad from the plural kinds of the setting conditions corresponding to the result, the setting pad does not include any pins, and
the setting pad is connected to a first line when the potential of the setting pad is set at a first potential, and is connected to a second line different from the first line when the potential of the setting pad is set at a second potential difference from the first potential.

2. The semiconductor integrated circuit according to claim 1, wherein the setting circuit refers to the particular setting condition stored in the setting register to set the operating condition at a point of a power-on reset.

3. The semiconductor integrated circuit according to claim 1, wherein the setting pad is connected to a power supply line of the semiconductor integrated circuit.

4. The semiconductor integrated circuit according to claim 1, wherein the memory region is set in a part of a memory cell array of a NAND flash memory.

5. The semiconductor integrated circuit according to claim 4, wherein the setting conditions include at least conditions for voltages set for a writing operation, a read-out operation and a deletion operation in the NAND flash memory, and conditions for setting a timing of executing each of the writing operation, the read-out operation and the deletion operation.

6. The semiconductor integrated circuit according to claim 4, wherein the setting conditions include conditions for setting the operations optimized for a storage mode of the NAND flash memory.

7. The semiconductor integrated circuit according to claim 1, wherein
the first potential is larger than the second potential,
the first line is a power supply line, and
the second line is a ground line.

8. The semiconductor integrated circuit according to claim 1, wherein the selection circuit configured to input data corresponding to the potential of the setting pad in a period in which a signal is at the second potential.

9. A method of examining a semiconductor integrated circuit, comprising:
setting a potential of a setting pad included in the semiconductor integrated circuit;
selecting a particular setting condition in accordance with the potential of a setting pad in a memory region that stores plural kinds of setting conditions;
reading the selected particular setting condition out of the memory region to store the particular setting condition in a setting register;
referring to the particular setting condition stored in the setting register to set an operating condition of the semiconductor integrated circuit comparing the potential of the setting pad with a reference potential; and
encoding data based on a result of comparing the potential of the setting pad with the reference potential
wherein the particular setting condition is selected in accordance with the potential of the setting pad in the memory region that stores the plural kinds of setting conditions by the encoded data, the setting pad does not include any pins, and the setting pad is connected to a first line when the potential of the setting pad is set at a first potential, and is connected to a second line different from the first line when the potential of the setting pad is set at a second potential difference from the first potential.

10. The method of examining the semiconductor integrated circuit according to claim 9, further comprising referring to the particular setting condition stored in the setting register to set the operating condition at a point of a power-on reset.

11. The method of examining the semiconductor integrated circuit according to claim 9, further comprising executing a test process for the semiconductor integrated circuit that operates in accordance with the set operating condition.

12. The method of examining the semiconductor integrated circuit according to claim 11, wherein executing the test process for the semiconductor integrated circuit in a wafer state or for the semiconductor integrated circuit after being packaged.

13. The method of examining the semiconductor integrated circuit according to claim 9, wherein the setting pad is connected to a power supply line of the semiconductor integrated circuit when the potential of the setting pad is set at the first potential, and connected to a ground line of the semiconductor integrated circuit when the potential of the setting pad is set at the second potential.

14. The method of examining the semiconductor integrated circuit according to claim 9, wherein the memory region is set in a part of a memory cell array of a NAND flash memory.

15. The method of examining the semiconductor integrated circuit according to claim 14, wherein the setting conditions include at least conditions for voltages set for a writing operation, a read-out operation and a deletion operation in the NAND flash memory, and conditions for setting a timing of executing each of the writing operation, the read-out operation and the deletion operation.

16. The method of examining the semiconductor integrated circuit according, to claim 14 wherein the setting conditions include conditions for setting the operations optimized for a storage mode of the NAND flash memory.

* * * * *